(12) United States Patent
Kundaliya et al.

(10) Patent No.: US 10,319,789 B2
(45) Date of Patent: Jun. 11, 2019

(54) METHOD FOR PRODUCING AN OPTOELECTRONIC COMPONENT AND AN OPTOELECTRONIC COMPONENT

(71) Applicant: OSRAM Opto Semiconductors GmbH, Regensburg (DE)

(72) Inventors: Darshan Kundaliya, Beverly, MA (US); David O'Brien, Bad Abbach (DE); Britta Göötz, Regensburg (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 334 days.

(21) Appl. No.: 15/236,379

(22) Filed: Aug. 12, 2016

(65) Prior Publication Data

US 2018/0047796 A1 Feb. 15, 2018

(51) Int. Cl.
*H01L 27/32* (2006.01)
*H01L 33/00* (2010.01)
(Continued)

(52) U.S. Cl.
CPC ...... *H01L 27/3213* (2013.01); *H01L 33/0075* (2013.01); *H01L 33/06* (2013.01);
(Continued)

(58) Field of Classification Search
CPC . H01L 27/3213; H01L 33/0075; H01L 33/06; H01L 33/50; H01L 33/502; H01L 2933/00; H01L 29/0033; H01L 2933/0041
(Continued)

(56) References Cited

U.S. PATENT DOCUMENTS 6,565,770 B1* 5/2003 Mayer .................. B82Y 10/00
106/403
6,696,703 B2* 2/2004 Mueller-Mach ........ H01L 33/50
257/103
(Continued)

FOREIGN PATENT DOCUMENTS

WO 9814986 A1 4/1998
WO 03065420 A2 8/2003

OTHER PUBLICATIONS

Choi, M.K. et al., "Wearable red-green-blue quantum dot light-emitting diode array using high-resolution intaglio transfer printing," Nature Communications, May 14, 2015, 8 pages.
(Continued)

*Primary Examiner* — Dzung Tran
(74) *Attorney, Agent, or Firm* — Slater Matsil, LLP

(57) ABSTRACT

An optoelectronic component and a method for producing an optoelectronic component are disclosed. In embodiments, the method includes A) providing an auxiliary carrier; B) applying a sacrificial layer on the auxiliary carrier; C) applying a converter layer on the sacrificial layer, which includes quantum dots embedded in a matrix material or a luminescent polymer; D) providing a semiconductor layer sequence; E) optionally applying an adhesive layer on the semiconductor layer sequence; F) optionally bonding the converter layer on the semiconductor layer sequence by means of an adhesive layer, wherein the semiconductor layer sequence is configured to emit radiation; and G) removing the auxiliary carrier by means of optical, mechanical and/or chemical treatment and at least partially destroying the sacrificial layer.

18 Claims, 4 Drawing Sheets

(51) Int. Cl.
*H01L 33/06* (2010.01)
*H01L 33/50* (2010.01)

(52) U.S. Cl.
CPC ............ *H01L 33/50* (2013.01); *H01L 33/502* (2013.01); *H01L 2933/00* (2013.01); *H01L 2933/0033* (2013.01); *H01L 2933/0041* (2013.01)

(58) Field of Classification Search
USPC .......................................................... 257/98
See application file for complete search history.

(56) References Cited

U.S. PATENT DOCUMENTS

| | | | |
|---|---|---|---|
| 6,740,604 B2 | 5/2004 | Kelly et al. | |
| 8,598,014 B2 | 12/2013 | Fehrer et al. | |
| 2008/0042153 A1* | 2/2008 | Beeson | H05B 33/10 257/94 |
| 2010/0020531 A1* | 1/2010 | Choi | G02F 1/133617 362/84 |
| 2010/0119839 A1* | 5/2010 | Chen | C09K 11/025 428/422 |
| 2010/0200886 A1* | 8/2010 | Krames | B82Y 30/00 257/98 |
| 2012/0273807 A1* | 11/2012 | Von Malm | H05B 33/10 257/88 |
| 2014/0339573 A1 | 11/2014 | Zimmerman et al. | |
| 2016/0023242 A1 | 1/2016 | Kundaliya et al. | |
| 2016/0093781 A1 | 3/2016 | Tamaki et al. | |

OTHER PUBLICATIONS

Qian, L. et al., "Stable and efficient quantum-dot light-emitting diodes based on solution-processed multilayer structures," Nature Photonics, vol. 5, Sep. 2011, pp. 543-548.

Kim, T.H. et al., "Full-Colour Quantum Dot Displays Fabricated by Transfer Printing," Nature Photonics, vol. 5, Mar. 2011, 8 pages.

* cited by examiner

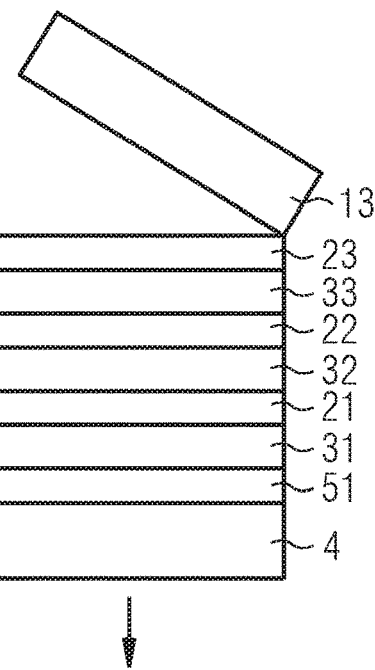
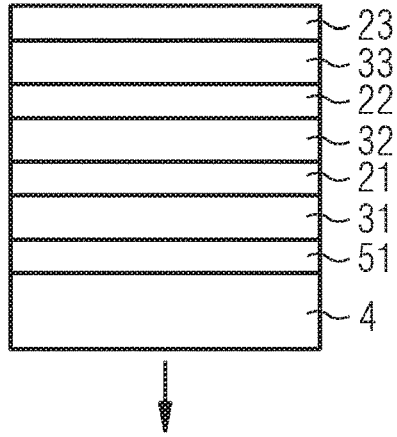
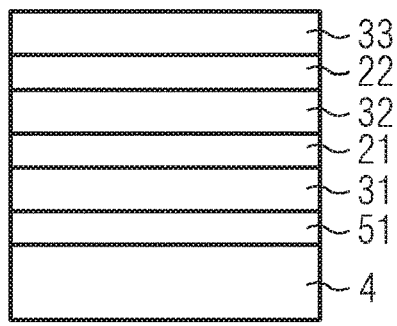

METHOD FOR PRODUCING AN OPTOELECTRONIC COMPONENT AND AN OPTOELECTRONIC COMPONENT

TECHNICAL FIELD

This invention relates to a method for producing an optoelectronic component and an optoelectronic component.

BACKGROUND

It is a well-known practice to use converter layers to convert light emitted from a semiconductor layer sequence, for example, from a light-emitting diode (LED), into longer wavelengths in order to affect the overall color of the light emitted from the LED package. Depending on the application and desired light output, the converter layers comprising quantum dots may convert only a portion of the light emitted by the semiconductor layer sequence, as in the case of white LEDs, or the converter layer may effect a full conversion of the radiation emitted by the semiconductor layer sequence.

SUMMARY

Embodiments provide a method for producing an optoelectronic component by means of which an optoelectronic component can be produced in a particularly cost-saving way. The produced optoelectronic component is especially suitable for warm white lighting having a high CRI (color rendering index).

In particular, the method has been simplified compared to conventional placement processes for producing converter layers on a semiconductor layer sequence by using a novel sacrificial layer approach.

According to one aspect of the method for producing an optoelectronic component, the method comprises the steps of: A) providing an auxiliary carrier; B) applying a sacrificial layer on the auxiliary carrier; C) applying a converter layer on the sacrificial layer which comprises quantum dots embedded in a matrix material or a luminescent polymer or a luminescent material; D) providing a semiconductor layer sequence; E) optionally applying an adhesive layer on the semiconductor layer sequence; F) optionally bonding the converter layer on the semiconductor layer sequence by means of an adhesive layer, wherein the semiconductor layer sequence is configured to emit radiation; and G) removing the auxiliary carrier by means of optical, mechanical and/or chemical treatment and at least partially destroying the sacrificial layer.

Steps E) and F) can be optional if the matrix material in which the quantum dots are embedded is used as an adhesive material. According to one aspect of the method, the steps are not optional if the matrix material is not used as an adhesive.

According to one aspect of the method, the method comprises the step of providing an auxiliary carrier. The auxiliary carrier can be a wafer. In particular the auxiliary carrier comprises sapphire or glass or consists of sapphire or glass.

Preferably the auxiliary carrier is removed using a laser lift-off process. A laser lift-off process is described, for example, in one of the following documents, the content of the disclosure of which in this regard is hereby incorporated by reference: WO 98/14986, WO 03/065420.

The auxiliary carrier can be transmissive to electromagnetic radiation of a laser. In particular the auxiliary carrier is removed by means of a laser lift-off process. The particular advantage in this case is that the auxiliary carrier is essentially not destroyed during the laser lift-off process so that the auxiliary carrier can be reused after corresponding conditioning.

According to one aspect of the method, the auxiliary carrier is removed in step G) by laser lift-off.

According to one aspect of the method, the auxiliary carrier is removed in step G) by etching or grinding.

In general the auxiliary carrier is removed in this case from an interface which is partially formed by a surface of the auxiliary carrier. In other words, the auxiliary carrier generally forms a shared interface with the auxiliary carrier which is freely accessible after the removal of the auxiliary carrier.

The auxiliary carrier can comprise silicon or consist of this material. By using silicon the auxiliary carrier is generally removed by means of etching or grinding. In this case the auxiliary carrier is generally destroyed and cannot be reused.

According to one aspect of the method, the method comprises the step of applying a sacrificial layer on the auxiliary carrier. The sacrificial layer can be an organic or inorganic material or can consist of an organic or inorganic material.

According to one aspect of the method, the sacrificial layer is selected from the group consisting of: GaN, $CeO_2$, AlN, SiNx, $HfO_2$ and $Ga_2O_3$.

According to one aspect of the method, the sacrificial layer is applied by one of the following methods: spin-coating, physical vapor deposition (PVD), chemical vapor deposition (CVD).

According to the application, the term "on" is understood to mean both the direct arrangement of elements with a common interface and an indirect arrangement, in which further elements can be present between the elements arranged one on top of the other. By way of example, further layers can be arranged between the carrier and the sacrificial layer. In an analogous form, an element is arranged "between" a first and a second element if the element is arranged on the first element and the second element is arranged on that side of the element which faces away from the first element, wherein "on" is understood as described above.

According to one aspect of the method, the method comprises the step of applying a converter layer on the sacrificial layer which comprises quantum dots embedded in a matrix material or a luminescent polymer materials or a luminescent material.

According to one aspect of the method, the luminescent polymers are selected from the group that may be used as or in a matrix material of a composite encapsulant consistent with the present disclosure. Non-limiting examples of suitable luminescent polymers that may be used in that regard include: (i) Perylene-based polymers such as yellow and red Lumogen® F (BASF) (ii) Conjugated polymer blends such as green emitting poly[{9,9-dioctyl-2,7-divinylenefluorenylene)-alto-co-(2-methoxy-5-(2-ethylhexyloxy)-1,4-phenylene}] (PFPV) and/or red emitting poly[1-methoxy-4-(2-ethylhexyloxy-2,5-phenylenevinylene)] (MEH-PPV); (iii) Composite encapsulated polymer dots (Pdots) such as poly[(9,9-dioctylfluorenyl-2,7-diyl)-alt-co-(1,4-benzo-{2,1',3}-thiadiazole)] (PFBT), poly(9,9-dioctylfluorenyl-2,7-diyl) (PFO), poly[2-methoxy-5-(2-ethylhexyloy)-1,4-(1-cyanovinylene phenylene)] (CN-PPV), and/or poly[(9,9-dioctyl-fluorene)-co-(4,7-di-2-thienyl-2,1,3-benzothiadiazole)] (PF-5DTBT; (iv) DCJTB color conversion layers such as (4-

(dicyanomethylene)-2-tert-butyl-6-(1,1,7,7-tetramethyljulolidyl-9-enyl)-4H-pyran); (v) Europium-containing copolymers such as poly[UA-MMA-co-Eu(DBM)$_2$(TOPO)$_2$]; (vi) Polysiloxane or composite encapsulant+fluorescent polymers FABD polymers such as red emitting polymer (9,9-dioctylfluorene (F), anthracene (A), 2,1,3-benzothiadiazole (B) and 4,7-bis(2-thienyl)-2,1,3-benzothiadiazole (D).

The converter layer, especially the quantum dots, is (are) able to convert light emitted from the semiconductor layer sequence into longer wavelengths. Depending on the application and desired light output, the quantum dots may convert only a portion of the radiation or may be able to convert the whole radiation emitted by the semiconductor layer sequence.

According to one aspect of the method, the quantum dots are selected from the group consisting of: InP, CdS, CdSe, InGaAs, GaInP, CuInSe$_2$, ZnSe, ZnS, CdTe, GaSe, AgGaSe$_2$, CuGaS$_2$, CuInS$_2$, CuGaSe$_2$, ZnGeP$_2$.

The quantum dots convert, for example, blue light emitted by the semiconductor layer sequence into longer wavelengths. In general quantum dots are sensitive to environmental conditions, for example, to oxygen, moisture and/or acid gases. In particular the quantum dots are nanoparticles which means that the particles have a size in the nanometer range, for example, the particles have a diameter $d_{50}$, for example, in the range between 1 nm as a minimum and 1,000 nm, as a maximum.

The quantum dots comprise a semiconductor core which has converting properties. In particular the core of the quantum dots comprises or consists of II/IV-order III/V-semiconductors. The core of the quantum dots can be coated by one or more layers. The coating can be organic or inorganic. In other words, the core of the quantum dots can be completely covered by further layers.

According to one aspect of the method, the quantum dots can have an average diameter of 3 nm to 10 nm and, in particular, from 3 nm to 5 nm. The wavelength of the converting radiation can be adjusted by variation of the size of the quantum dots. The shape of the quantum dots can be spherical or rod-shaped.

According to one aspect of the method, the converter layer comprises a matrix material. The matrix material is selected from the group consisting of silicone, epoxy and wax. In particular, the matrix material is silicone.

According to one aspect of the method, the method comprises the step of providing a semiconductor layer sequence. The semiconductor layer sequence of the optoelectronic component is preferably based on a III-V compound semiconductor material. The semiconductor material is preferably a nitride compound semiconductor material such as $Al_nIn_{1-n-m}Ga_mN$ or else a phosphide compound semiconductor material such as $Al_nIn_{1-n-m}Ga_mP$, wherein in each case 0≤n≤1, 0≤m≤1 and n+m≤1. The semiconductor material can likewise be $Al_xGa_{1-x}As$, where 0≤x≤1. In this case, the semiconductor layer sequence can comprise dopants and additional constituents. For the sake of simplicity, however, only the essential constituents of the crystal lattice of the semiconductor layer sequence, that is to say Al, As, Ga, In, N or P, are specified, even if these can be replaced and/or supplemented in part by small amounts of further substances.

The semiconductor layer sequence comprises an active layer having at least one pn-junction and/or having one or a plurality of quantum well structures. During the operation of the semiconductor chip an electromagnetic radiation is generated in the active layer. The wavelength of the radiation is preferably in the ultraviolet and/or visible spectral range, in particular a wavelength of between 420 nm and 680 nm inclusive, for example, between 440 nm and 480 nm inclusive.

According to at least one embodiment, the semiconductor layer sequence is a light-emitting diode, abbreviated LED.

In another aspect of the invention, the semiconductor layer sequence is an organic light-emitting diode, or OLED, for short.

The semiconductor layer sequence may be designed to emit blue, red, green, orange, yellow or purple light. In particular the semiconductor layer sequence is configured to emit blue light.

In the case of an organic light-emitting diode the semiconductor layer sequence is an organic functional layer stack. The organic functional layer stack may comprise layers with organic polymers, organic oligomers, organic monomers, organic small non-polymeric molecules (small molecule) or combinations thereof. Materials suitable as materials for the organic light-emitting layer are materials which have radiation emission based on fluorescence or phosphorescence, for example, polyfluorene, polythiophene or polyphenylene, or derivatives, compounds, mixtures or copolymers thereof. The organic functional layer stack may also comprise a plurality of organic light-emitting layers, which are arranged between the electrodes. The organic functional layer stack may further comprise a functional layer which takes the form of a hole transport layer, to allow effective hole injection into the at least one light-emitting layer. Materials which may prove advantageous for a hole transport layer are, for example, tertiary amines, carbazole derivatives, polyaniline doped with camphorsulfonic acid or polyethylenedioxythiophene doped with polystyrenesulfonic acid. The organic functional layer stack may further comprise a functional layer, which takes the form of an electron-transport layer. Furthermore, the layer stack may also comprise electron- and/or hole-blocking layers.

According to one aspect of the method, the sacrificial layer can be formed as a thin film. Herein and in the following "thin film" may mean that the thickness of the sacrificial layer is 100 nm to 2 μm and, more preferably, less than 1 micrometer.

The thin films of the sacrificial layers are deposited via multiple methods on a carrier to create a template for subsequent transfer of a converter layer, especially a converter layer comprising quantum dots or luminescent polymers. The deposition methods may be spin-coating, physical vapor deposition or chemical vapor deposition for a sacrificial layer.

The sacrificial layer may also be chosen such that it is dissolved in water or in a solvent.

According to one aspect of the method, the method comprises the step of applying an adhesive layer on the semiconductor layer sequence. The adhesive layer comprises a material which is selected from the group consisting of silicone, epoxy, and wax-filled epoxy. In principle all adhesive materials which are transparent for the radiation emitted by the semiconductor layer sequence and/or emitted by the converter layer are suitable. This step can be optional if the matrix material in which the quantum dots are embedded is used as an adhesive material.

The multilayer stacking of layer-by-layer of quantum dots are bonded using a standard silicone matrix with an intermediate step of a lift-off via laser or chemicals.

RGB micropixel patterning could also be envisioned using the above transferring process instead of multilayer structures for a single large LED, for example, patterning the carrier first into pixelated structures and then applying the transferring techniques proposed here to the pixelated LED structure or to a single LED. In other words, the method is suitable for producing a single optoelectronic component or multiple optoelectronic components arranged on a wafer. Such a process of transferring quantum dot converters or converter layers could also be envisioned at the wafer level rather on a single layer LED level.

According to one aspect of the method, the method steps A) to G) are repeated once more so that a white-emitting optoelectronic component is produced. The white-emitting optoelectronic component, especially the white-emitting inorganic or organic light-emitting diode, has a stack of two converter layers, wherein the semiconductor layer sequence emits radiation in the blue wavelength range during operation. The first converter layer emits radiation in the red wavelength range and the second converter layer emits radiation in the green wavelength range during operation.

According to one aspect of the method, steps A) to G) are repeated at least twice so that an optoelectronic component is produced which has a stack of at least three converter layers. The method or steps A) to G) can be repeated x times where x≥1 in order to produce an optoelectronic component which has x+1 converter layers. Especially steps A) to G) are performed in this given order.

According to one aspect of the method, the converter layers are arranged downstream of the semiconductor layer sequence in a main emission direction and/or are configured to emit radiation of different wavelength ranges. Alternatively the converter layers are configured to emit radiation in the same wavelength ranges. The converter layers are configured, for example, to emit radiation in the blue, yellow or red spectral range so that the optoelectronic component emits white radiation. The white radiation is the sum of the radiation of the several converter layers and optionally the semiconductor layer sequence. Especially the resulting white light is warm white light. Additionally the optoelectronic component comprises a high CRI (color rendering index).

According to one aspect of the method, steps A) to G) are repeated at least twice so that an optoelectronic component is produced wherein the converter layers are arranged as structures in a plane when viewed in cross-section onto the optoelectronic component.

According to one aspect of the method, a white-emitting optoelectronic component is produced wherein the first converter layer is configured to emit radiation in the blue wavelength range, the second converter layer is configured to emit radiation in the red wavelength range and the third converter layer is configured to emit radiation in the yellow to green wavelength range.

According to one aspect of the method, a white-emitting optoelectronic component is produced wherein the first converter layer is configured to emit radiation in the green wavelength range, the second converter layer is configured to emit radiation in the red wavelength range and the third converter layer is configured to emit radiation in the yellow to green wavelength range. The semiconductor layer sequence is configured to emit radiation in the blue wavelength range.

According to one aspect of the method, the converter layer or of each converter layer has a maximum thickness of is 2 µm, especially 1 µm to 2 µm for full conversion and/or <1 µm for partial conversion. Partial conversion means that the radiation of the semiconductor layer sequence is part of the radiation of the optoelectronic component.

The inventors have found that a white light-emitting optoelectronic component with a high CRI can be produced by this process. This process produces a stack of embedded quantum dots in a matrix material, especially in a polymer matrix, via a transfer process.

The method describes the feasibility of forming multilayers of quantum dots embedded in a polymer matrix and transferred onto optoelectronic components, for example, LEDs, by means of optical (lift-off), chemical, or mechanically techniques. All quantum dots wavelength converters exhibit a high QE and a high CRI. Currently there is no standard handling system for standalone quantum dots. The simplification of the placement process of quantum dots multilayers on an optoelectronic component die using a novel sacrificial layer approach is described.

Alternatively, the optoelectronic component can also be produced by solution processed multilayer structures or quantum dots LED array by transfer printing.

Embodiments of the invention also relates to an optoelectronic component which is particularly produced by the above-mentioned method. All embodiments mentioned for the method are also valid for the optoelectronic component and vice versa.

BRIEF DESCRIPTION OF THE DRAWINGS

Embodiments and developments of the herein described method and component will become apparent from exemplary embodiments described below in association with the figures. In the figures:

FIGS. 1A to 1C, 2A to 2F, and 3A to 3D show a sectional view of optoelectronic components which were produced by the above-mentioned method.

The elements illustrated in the figures and their mutual size ratio should not be regarded as true to scale. Rather, the individual elements may be represented with an exaggerated size for the sake of better representability and/or for the sake of better understanding

DETAILED DESCRIPTION OF ILLUSTRATIVE EMBODIMENTS

Figure 1A:
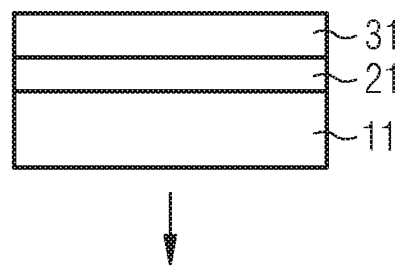
Figure 1B:
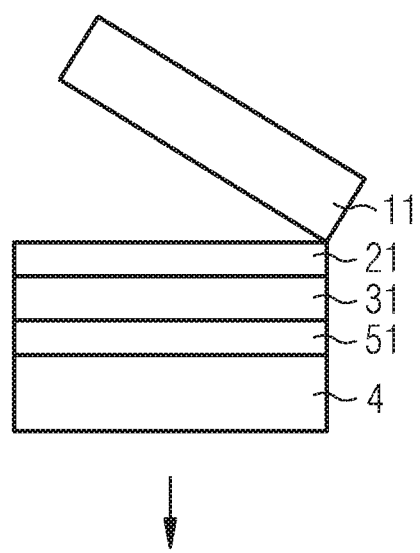
Figure 1C:
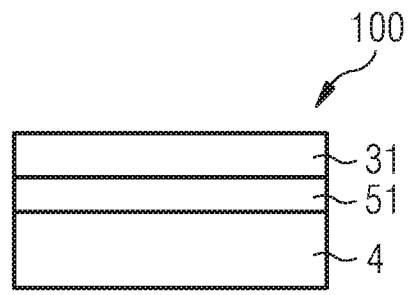

FIGS. 1A to 1C show a method for producing an optoelectronic component comprising the first converter layer. In FIG. 1A an auxiliary carrier 11 is provided. The auxiliary carrier can be made of glass. A sacrificial layer 21, for example, GaN, is applied on the auxiliary carrier 11. A converter layer 31, which is configured to emit radiation, is applied on the sacrificial layer 21. After providing a semiconductor layer sequence 11, for example, an inorganic optoelectronic component (LED) or organic optoelectronic component (OLED), an adhesive layer 51 is applied on the semiconductor layer sequence 4. After this the converter layer 31 is bonded on the semiconductor layer sequence 4 by means of the adhesive layer 51. Especially the semiconductor layer sequence 4 is configured to emit radiation, especially radiation in the blue wavelength range. After this an optical, mechanical and/or chemical treatment is carried out, especially a lift-off process in order to destroy the sacrificial layer 21. In particular the auxiliary carrier 11 is not destroyed by step G). By leaving the auxiliary carrier 11, only the converter layer comprising quantum dots and partially the sacrificial layer 21 remain on the semiconductor layer sequence 4. The sacrificial layer 21 can optionally be removed by dissolving or etching techniques.

FIG. 1C shows the final optoelectronic component 100 comprising a semiconductor layer sequence 4, an adhesive layer 51 and at least one converter layer 31. The converter layer 31 can convert only a portion of the light emitted by the semiconductor layer sequence 4 or can fully convert the radiation emitted by the semiconductor layer sequence 4.

FIGS. 2A to 2F show a method for producing an optoelectronic component 100 which comprises three converter layers. The converter layers are arranged downstream of the semiconductor layer sequence 4 in a main emission direction and in particular are configured to emit radiation of different wavelength ranges.

Figure 2A:
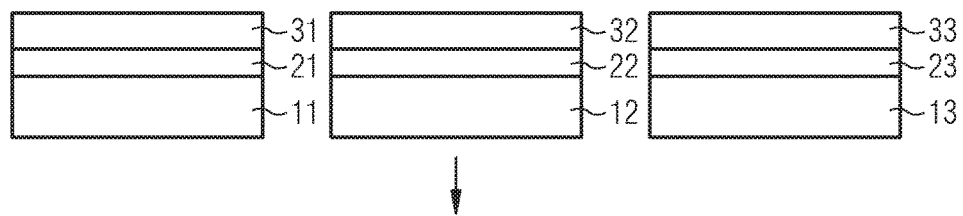
Figure 2B:
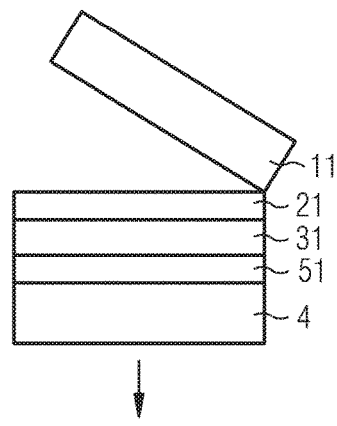
Figure 2C:
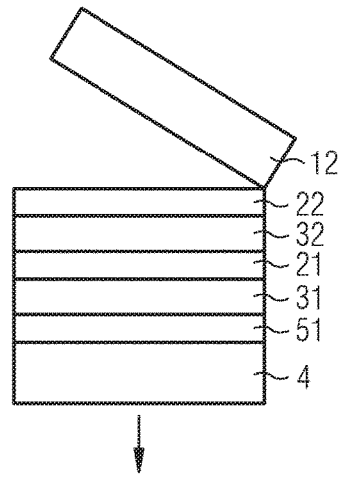
Figure 3A:
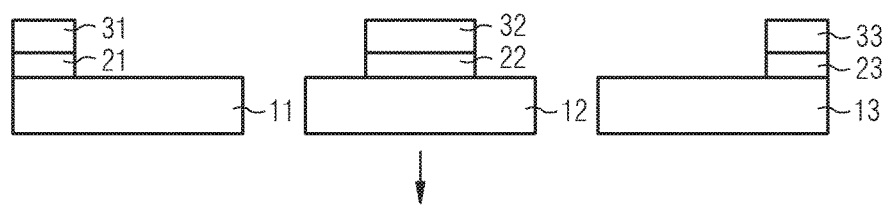
Figure 3B:
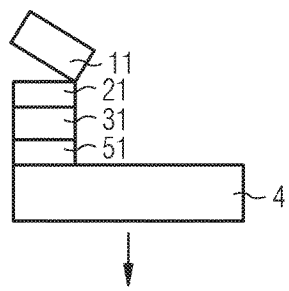
Figure 3C:
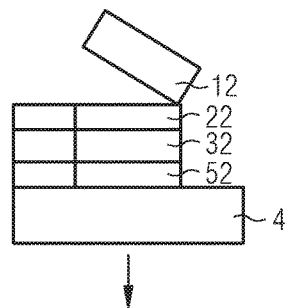
Figure 3D:
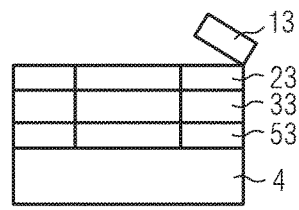

FIG. 2A shows three auxiliary carriers 11, 12, and 13. On each auxiliary carrier, a sacrificial layer 21, 22, 23 and a converter layer 31, 32, 33 are arranged. As shown in FIG. 2B the first auxiliary carrier 11 with the first sacrificial layer 21 and the first converter 31 are applied on the adhesive layer 51 on the semiconductor layer sequence 4. In the next step the second converter layer 32 is applied on the first converter layer 31, as shown in FIG. 2C. Between the steps of applying the first and the second converter layers, the auxiliary carriers are removed by means of laser lift-off, wherein the sacrificial layer is destroyed.

FIG. 2D shows the step of removing the third auxiliary carrier 13 so that an optoelectronic component results as shown in FIG. 2E with the layer order:
semiconductor layer sequence 4,
first adhesive layer 51,
first converter layer 31,
first sacrificial layer 21,
second converter layer 32,
second sacrificial layer 22,
third converter layer 33,
third sacrificial layer 23.

The first adhesive layer 51 can be optional if the matrix material in which quantum dots are embedded can used as an adhesive material too.

Optionally, the sacrificial layers can be removed by dissolving or etching techniques. Optionally, further adhesive layers can be arranged between the converter layers.

FIG. 2F shows that the third sacrificial layer 23 is removed.

FIGS. 3A to 3D show a method for producing an optoelectronic component which comprises three converter layers. The converter layers are arranged in a structural way, which means that the converter layers are arranged in a plane when viewed in cross-section onto the optoelectronic component 100. Steps A) to G) are performed three times so as to produce an optoelectronic component 100 which comprises three converter layers. Especially the converter layers are arranged in one plane and emit radiation of the same or of different wavelength ranges.

The second converter layer is bonded using a polymer adhesive followed by lift-off to have multilayer quantum dot converters with two different properties.

The x converter layers are bonded using polymer adhesive followed by lift-off to have multilayer quantum dot converters with various different properties.

The herein disclosed invention is not restricted to the exemplary embodiments of the description on the basis of the said exemplary embodiments. Rather, the invention encompasses any new feature and also any combination of features which in particular comprises any combination of features in the patent claims and any combination of the features in the exemplary embodiments even if this feature or this combination itself is not explicitly specified in the patent claims or the exemplary embodiments.

What is claimed is:

1. A method for producing an optoelectronic component, the method comprising:
    A) providing an auxiliary carrier;
    B) applying a sacrificial layer on the auxiliary carrier;
    C) applying a first converter layer on the sacrificial layer, the first converter layer comprises quantum dots embedded in a matrix material or a luminescent polymer;
    D) providing a semiconductor layer sequence, wherein the first converter layer is in direct contact with the semiconductor layer sequence; and
    E) removing the auxiliary carrier by optical, mechanical and/or chemical treatment and partially destroying the sacrificial layer such that the sacrificial layer partially remains at a side of the first converter layer facing away from the semiconductor layer sequence.

2. The method according to claim 1, wherein steps A) to E) are repeated once more, so that a white emitting optoelectronic component is produced which has a stack of two converter layers, wherein the semiconductor layer sequence is configured to emit radiation in a blue wavelength range, wherein the first converter layer is configured to emit radiation in a red wavelength range and a second converter layer is configured to emit radiation in a green wavelength range.

3. The method according to claim 1, wherein steps A) to E) are repeated at least twice, so that an optoelectronic component is produced which has a stack of at least three converter layers.

4. The method according to claim 3, wherein a white emitting optoelectronic component is produced, wherein the first converter layer is configured to emit radiation in a green wavelength range, wherein a second converter layer is configured to emit radiation in a red wavelength range, and wherein a third converter layer is configured to emit radiation in a yellow wavelength range.

5. The method according to claim 1, wherein the first converter layer is arranged downstream of the semiconductor layer sequence in a main emission direction and are configured to emit radiation in different wavelength ranges.

6. The method according to claim 1, wherein steps A) to E) are repeated at least twice, so that an optoelectronic component is produced wherein converter layers are arranged structured in a plane, when viewed in cross section, onto the optoelectronic component.

7. The method according to claim 1, wherein a maximum thickness of the first converter layer is 2 µm.

8. The method according to claim 1, wherein the auxiliary carrier in step E) is removed by laser lift-off.

9. The method according to claim 1, wherein the auxiliary carrier in step E) is removed by etching or grinding.

10. The method according to claim 1, wherein the sacrificial layer is made of an organic or inorganic material.

11. The method according to claim 1, wherein the sacrificial layer comprises a material which is selected from the group consisting of GaN, $CeO_2$, AlN, SiNx, $HfO_2$ and $Ga_2O_3$.

12. The method according to claim 1, wherein the sacrificial layer is applied by one of the following methods: spin-coating, physical vapor deposition, chemical vapor deposition.

13. The method according to claim 1, wherein the quantum dots are selected from the group consisting of InP, CdS, CdSe, InGaAs, GaInP, $CuInSe_2$, ZnSe, ZnS, CdTe, GaSe, $AgGaSe_2$, $CuGaS_2$, $CuInS_2$, $CuGaSe_2$ and $ZnGeP_2$.

14. The method according to claim 1, wherein the matrix material or adhesive layer material is selected from the group consisting of silicone, epoxy, and wax.

15. The method according to claim 1, wherein the semiconductor layer sequence is an organic or inorganic light-emitting diode.

16. An optoelectronic component comprising:
- a first converter layer on a sacrificial layer, wherein the first converter layer comprises quantum dots embedded in one of a matrix material or a luminescent polymer;
- a semiconductor layer sequence, wherein the first converter layer is in direct contact with the semiconductor layer sequence; and
- the sacrificial layer which is arranged at a side of the first converter layer facing away from the semiconductor layer sequence.

17. The method according to claim 1, wherein a second converter layer is applied at the side of the first converter layer facing away from the semiconductor layer sequence;
- wherein the sacrificial layer is arranged between the first and the second converter layer, and
- wherein the sacrificial layer is in direct contact with the first and the second converter layer.

18. The optoelectronic component according to claim 16, wherein the sacrificial layer is selected from the group consisting of: GaN, $CeO_2$, AN, $SiN_x$, $HfO_2$, $Ga_2O_3$.

* * * * *

UNITED STATES PATENT AND TRADEMARK OFFICE
CERTIFICATE OF CORRECTION

PATENT NO.          : 10,319,789 B2
APPLICATION NO.     : 15/236379
DATED               : June 11, 2019
INVENTOR(S)         : Darshan Kundaliya Page 1 of 1

It is certified that error appears in the above-identified patent and that said Letters Patent is hereby corrected as shown below:

In the Claims

In Column 9, Line 26, Claim 18, delete "AN" and insert --A1N--.

Signed and Sealed this
Third Day of September, 2019

Andrei Iancu
*Director of the United States Patent and Trademark Office*